United States Patent [19]
Fournel

[11] Patent Number: 6,144,078
[45] Date of Patent: Nov. 7, 2000

[54] METHODS FOR PROGRAMMING READ-ONLY MEMORY CELLS AND ASSOCIATED MEMORIES

[75] Inventor: Richard Pierre Fournel, Lumbin, France

[73] Assignee: SGS-Thomson Microelectronics S.A., Gentilly, France

[21] Appl. No.: 08/688,298

[22] Filed: Jul. 30, 1996

[30] Foreign Application Priority Data

Jul. 31, 1995 [FR] France ................................. 95 10186

[51] Int. Cl.⁷ .............................. H01L 29/76; H01L 29/94
[52] U.S. Cl. ........................................... 257/390; 257/402
[58] Field of Search .................................. 257/402, 390, 257/403, 404

[56] References Cited

U.S. PATENT DOCUMENTS

| | | | |
|---|---|---|---|
| 4,282,646 | 8/1981 | Fortino et al. ........................... | 257/390 |
| 5,200,802 | 4/1993 | Miller ...................................... | 257/390 |

FOREIGN PATENT DOCUMENTS 0 213 983  3/1987  European Pat. Off. ............... 257/390

OTHER PUBLICATIONS

French Search Report from French Patent Application 95 09328, filed Jul. 31, 1995.
Patent Abstracts of Japan, vol. 8, No. 221 (E–271)[1658], Oct. 9, 1984 & JP–A–59 103368.

Primary Examiner—Steven H. Loke
Attorney, Agent, or Firm—Wolf, Greenfield & Sacks, P.C.; James H. Morris; Theodore E. Galanthay

[57] ABSTRACT

A method for programming a read-only memory cell including a transistor whose source and drain, which have a second type of doping, are formed in a semiconductor substrate with a first type of doping, includes a step of carrying out a contradoping in a region of the source, the region being adjacent to the conduction channel 4, to make it a region with the first type of doping so as to prevent a transistor effect from occurring.

14 Claims, 3 Drawing Sheets

METHODS FOR PROGRAMMING READ-ONLY MEMORY CELLS AND ASSOCIATED MEMORIES

BACKGROUND OF THE INVENTION

1. Field of the Invention

The invention relates to programming read-only memory (ROM) cells in MOS or CMOS technology.

2. Discussion of the Related Art

A programmed read-only memory cell and a non-programmed read-only memory cell show electrically different behavior when they are subjected to the same read signals, i.e., one of them conducts very little current or even no current at all, while the other conducts high current, at least ten to one hundred times higher than the former. Hereinafter, it shall be assumed, by convention, that the programmed cell is the one that conducts no current.

The manufacturers of read-only memories are particularly interested in methods that enable programming in the upper layers of the circuit, i.e., that come into play at an advanced stage of manufacture of the integrated circuit, even for example in the final layers.

In this field, there is in particular a known way of carrying out a drain contradoping operation for a transistor in a drain region adjacent to the conduction channel so as to have a reversed bias junction at the drain. This reversed bias junction, which is located upline with respect to the transistor, prevents the passage of the current in read mode. This programming method and the associated manufacturing method are described in the document EP 92830552.3 which is herein incorporated by reference.

This technique requires the making of a basic transistor (non-programmed) with a weakly doped drain and the carrying out a deep (not surface) contradoping implantation to obtain a reversal of the type of doping throughout the depth of the region of the drain considered. With a more highly doped drain, there would remain a channel with the initial type of doping beneath this region and the desired effect would not be obtained. However, this weak doping of the drain and hence the low mobility of the carriers in the drain gives rise to high access resistance in the transistor and hence low current in reading mode even if the source is more highly doped in order to improve the conduction.

Furthermore, depending on the junction gradient obtained, which depends on the energy and the profile of implantation of the contradoping, it is possible to have a junction with a high breakdown voltage but also with substantial leakage currents, especially under heat. Or else, on the contrary, there may be a junction with leakage currents almost equal to zero, but then with a low breakdown voltage (abrupt junction). Now, firstly, the leakage currents are very inconvenient, and secondly if the breakdown voltage is very low, the junction will conduct current in reverse in read mode and the transistor will be read as being non-programmed. This is very inconvenient and calls for very painstaking operations to adjust the energy and doping levels in order to minimize the leakage currents while at the same time having sufficiently high breakdown voltage. The reproducibility of this programming method and hence its reliability are thereby affected.

An object of the invention is to provide a method of programming that does not have these different drawbacks, and an associated memory.

Another object of the invention is to provide a method of programming that can be carried out at an advanced stage of manufacture and is reliable and reproducible, and an associated memory.

SUMMARY OF THE INVENTION

An embodiment of the invention is directed to a method for programming a read-only memory cell including a transistor formed in a semiconductor substrate with a first type of doping, with a drain and a source having a second type of doping separated in the substrate by a conduction channel. The method includes a step of carrying out a contradoping on at least one region of the source, the region being adjacent to the conduction channel, to make it a region with a first type of doping so as to prevent a transistor effect from occurring.

Another embodiment of the invention is directed to a memory in integrated circuit form including programmed cells and/or non-programmed cells formed by a transistor, each transistor having a drain and a source separated by a conduction channel. The source of the transistor of each of the programmed cells comprises at least one region that is adjacent to the conduction channel and has the same type of doping as the channel.

BRIEF DESCRIPTION OF THE DRAWINGS

Other features and advantages of the invention are presented in the description given by way of an indication that in no way restricts the scope of the invention, and with reference to the appended figures, of which.

DETAILED DESCRIPTION

Figure 1:
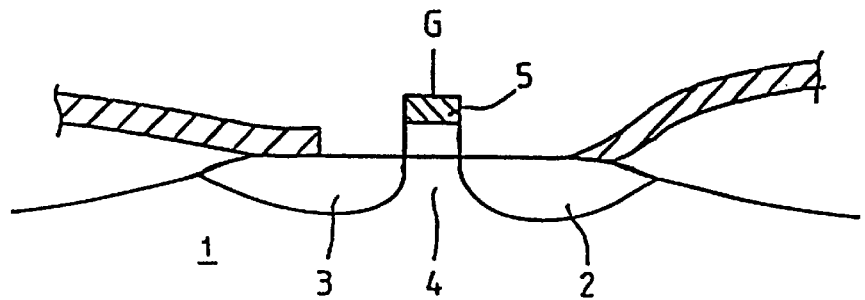
FIG. 1 shows a basic structure of a transistor of a read-only memory cell according to an embodiment of the invention.

As shown in FIG. 1, the basic structure of a read-only memory cell according to an embodiment of the invention is a transistor made in a semiconductor substrate 1 with a first type of doping. A drain 2 and a source 3 have a second type of doping. They are separated in the substrate by a conduction channel 4 located beneath a gate 5 of the transistor. In the example, the first type of doping is the p type doping and the second type doping is the n type doping.

Figure 2:
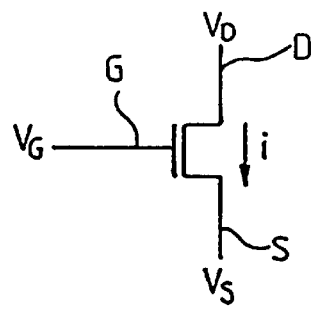
FIG. 2 shows an electrical diagram corresponding to the embodiment shown in FIG. 1.

The diagram of the corresponding transistor is shown in FIG. 2. A structure of this kind subjected to read voltages VG, VD, VS applied respectively to a gate line G, a drain line D and a source line S conducts a current i by transistor effect in the conduction channel (FIG. 2).

Programming this structure includes a step of making it non-conductive for these same read voltages.

According to an embodiment of the invention, the programming method includes carrying out a source contradoping and not a drain contradoping, as indicated in the document EP 92830552.3.

Figure 3:
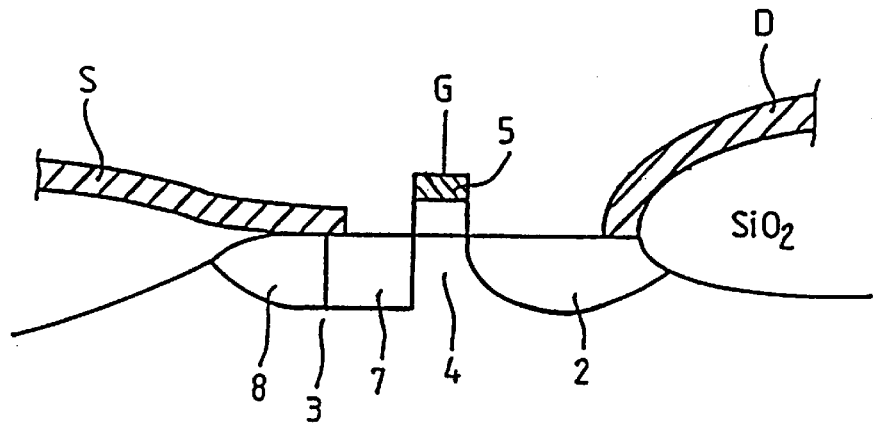
FIG. 3 shows the structure of a read-only memory cell programmed according to the programming method of an embodiment of the invention.

One structure obtained is shown in FIG. 3. In the example, a source contradoping has been made on a region 7 of the source 3. The region 7 is adjacent to the conduction channel 4. In this region, the doping becomes a doping of the first type. Seen from the conduction channel, the source and the drain have opposite types of doping. Furthermore, the region 7 increases the bias of the source with respect to the reference of the substrate, which is the ground in the example. The transistor effect in the conduction channel can no longer occur. There is a degenerate transistor. It is quite possible to apply the contradoping to the entire source (not shown) especially for an insulated cell (fuse) or only on a region of the source adjacent to the channel as shown.

For the manufacture of non-insulated cells (with common sources), the source of a degenerate transistor according to an embodiment of the invention may thus include a region 8 with the second type of doping, and the region 7, adjacent to the channel and having the same type of doping as the substrate. In this case, there is again a junction, but here it is a forward biased junction. It does not, in any way, play a role in the behavior of the degenerate transistor. Preferably, and as shown in FIG. 3, it is chosen to short circuit this junction. This is done simply with a source line coming into contact with the two regions 7 and 8.

In practice, to carry out the contradoping according to an embodiment of the invention, it is possible for example to apply the method for the contradoping of the drain, developed in the document EP 92830552.3, to the source or to a region of the source adjacent to the channel of the basic transistor of the invention.

In particular, to make it possible to carry out this contradoping of the source throughout the depth of the first implantation with impurities of the second type (n), it is necessary that this doping with impurities of the second type should be low (n−). The result thereof is high resistance in the source. To improve the conductivity of the non-programmed basic transistor (FIG. 1), it is preferably chosen to have a stronger doping of the drain (n+), hence a doping that is less resistive. The basic transistor will therefore be a transistor which has weak doping of the source and which, when programmed, will have a source including a region (7) adjacent to the channel and having the same type of doping as the substrate. If necessary, as seen here above, the source of the programmed transistor may include another region (8) having the same type of doping. It is the more weakly doped (n−) than the drain.

The principle of programming according to an embodiment of the invention, based on the degeneration of the structure of the basic transistor, differs totally from the method of programming by junction developed in the document EP 92830552.3.

In the embodiment of the invention, it is possible again to have a junction which, however, is forward-biased, has no role in the degenerescence of the transistor and furthermore can easily be short-circuited.

The embodiment of the invention is used to carry out the programming in the high layers of the circuit, namely very late in the manufacturing process after the making of the gates.

Steps of an exemplary method for the manufacture of a memory of programmed and non-programmed ROM cells according to an embodiment of the invention are thus shown in FIGS. 4 to 9.

Figure 4:
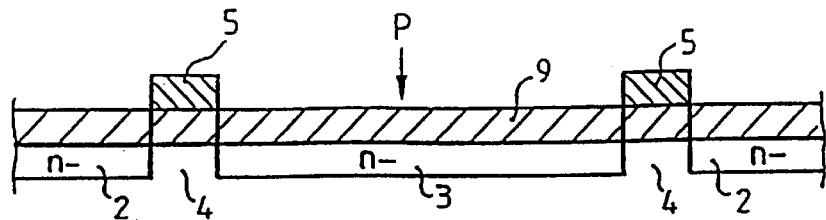
FIGS. 4 to 9 show different steps of an exemplary method for the manufacture of ROM cells according to an embodiment of the invention.

FIG. 4 shows a structure according to the embodiment after a step in the manufacture, in a P type substrate, of two transistors (not insulated) with a common source 3. The drains 2 and the common source 3 are weakly doped N type regions with ion implantation that is self-aligned on the polysilicon gates 5 of the transistors, through a thin oxide layer 9 deposited on the substrate.

Figure 5:
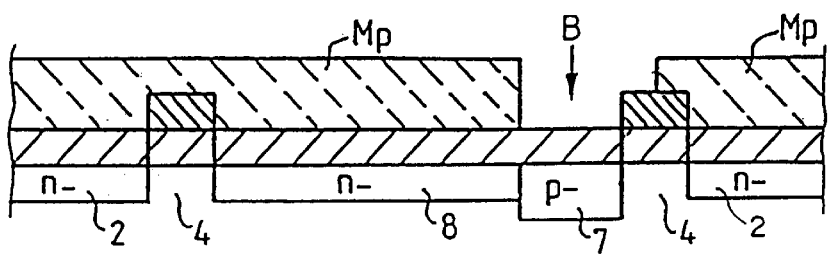

FIG. 5 shows the structure including programmed cells after a subsequent step. In the example illustrated by FIGS. 5 to 8, the right-hand cell is programmed while the left-hand cell is not programmed.

Thus, a P type implantation mask Mp has an aperture at the position of a region 7 of the source 3 of the right-hand transistor which is adjacent to the conduction channel 4. For example, the material used will be boron (B) for this ion implantation. A region 7 of the same type (p−) as the substrate is obtained.

Figure 6:
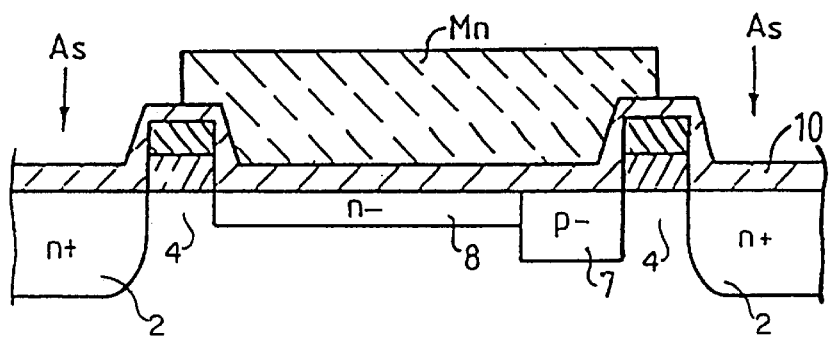

Preferably, to reduce the resistivity of the transistor, there is provided a step for implantation of N type impurities to obtain higher (n+) doping of the drains 2. FIG. 6 shows the structure after the implementation step. After having removed the layer 9 of thin oxide on the drains and source, the entire surface is reoxidized. A layer 10 of oxide is obtained. A mask Mn then protects the source, and arsenic (AS) is used the increase the doping of the drain regions. The drains become deeper, with a less abrupt junction on the gate side.

Then, the metal connections must be made on the source and drains.

Figure 7:
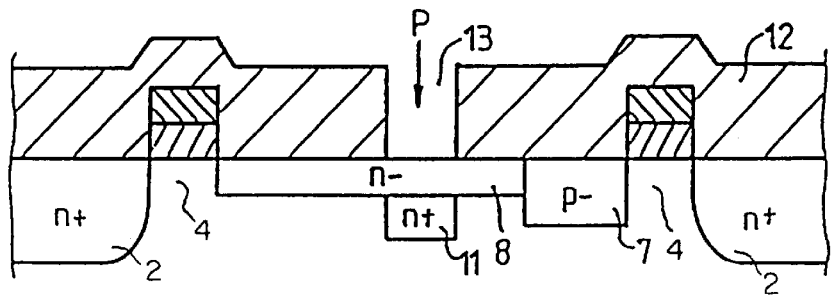

In the example shown, it is necessary, first of all, to make an n+ type region 11 beneath the n− type region 8 of the source 3 so that it is then possible to have appropriate metal contact with the source. This is what is shown in FIG. 7. A thick layer of insulator 12 is deposited and then an aperture 13 is made in this layer up to the surface of the substrate. A phosphorous implantation (P) enables the creation of the n+ region 11 beneath the region 8.

The metal contacts can then be made on the source and drains (FIG. 8): apertures 14 and 15 are made in the layer of insulator for each drain. Then metal is deposited. This metal fills the source aperture 13 and the drain apertures 14 and 15.

Figure 8:
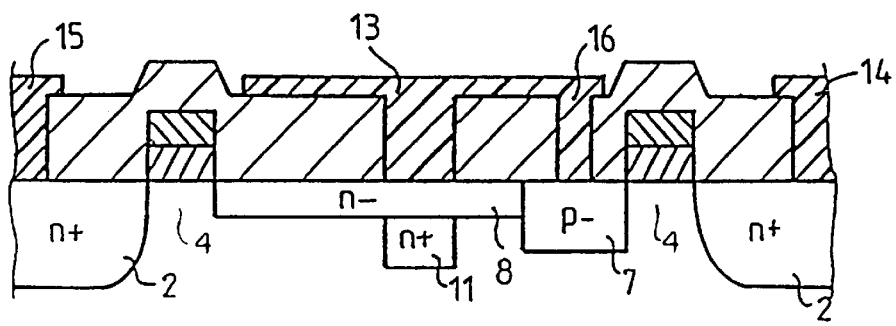
Figure 9:
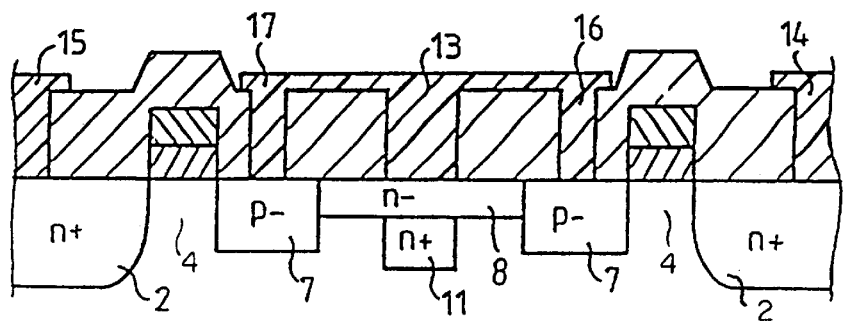

Preferably, and as shown in FIG. 8, there is provision for short-circuiting the regions 7 and 8 in the source. Hence an aperture 16 will also be made in the insulator at the level of this region 7, and the metal layer deposited on the source is such that it is continued between the two apertures 13 and 16 that it fills. In fact, the pattern of the metal deposit on the source is such that it could fill three apertures, 13, 16, 17 i.e., that of n− region and those of two p− regions on each side of the n− region when the transistors with a common source are both programmed. This is what is shown in FIG. 9.

A read-only memory in integrated circuit form will thus include, according to an embodiment of the invention, a matrix of programmed and/or non-programmed cells formed by a basic transistor according to an embodiment of the invention. The source of the transistor of each programmed cell will have a region adjacent to the channel having the same type of doping as the substrate to prevent the transistor effect from occurring. The source could also include another region having the same type of doping as the drain of the conduction channel of the transistor.

Finally, the description made with reference to the appended drawings refers to transistors made in a p type substrate. However, the present invention could equally well be applied to transistors made in an n type substrate or in n or p type wells.

Having thus described several particular embodiments of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention.

Accordingly, the foregoing description is by way of example only and is not intended to be limiting. The invention is limited only as defined in the following claims and equivalents thereto.

What is claimed is:

1. A memory, comprising:
   a plurality of cells formed in a substrate of a first doping type, the plurality of cells including a programmed first cell having a drain of a second doping type, a conduction channel of the first doping type, and a source including non-conducting means for providing a non-conducting response in a region of the source that contacts the conduction channel to prevent a transistor effect from occurring between the drain and the source when predetermined voltages are applied to the programmed first cell to read the programmed first cell;
   wherein the non-conducting means is a first region of the source of the programmed first cell contradoped such that the first region is of the first doping type to form a degenerate transistor as the programmed first cell; and
   wherein the source of the programmed first cell further includes:
      a metal contact that contacts the non-conducting means.

2. A method for programming a read-only memory cell including a transistor formed in a semiconductor substrate of a first doping type, the transistor having a drain and a source of a second doping type separated in the substrate by a conduction channel, the method comprising the step of:
   contradoping a first region of the source such that the first region is of the first doping type to prevent a transistor effect from occurring, the first region contacting the conduction channel, wherein the step of contradoping includes a step of contradoping only the first region of the source of the transistor such that a second region of the source remains of the second doping type; and
   short-circuiting together the first region and the second region of the source with a contact line.

3. A memory, in integrated circuit form, comprising:
   a plurality of transistors that form a corresponding plurality of memory cells, wherein each transistor has a drain and a source separated by a conduction channel, wherein a first transistor forms a corresponding programmed cell, wherein the conduction channel contacts a first region of the source, and wherein a doping type of the first region of the source is modified to a different doping type such that the conduction channel and the first region are of the same doping type;
   wherein the drain and a second region of the source of the first transistor are of the same doping type; and
   wherein the first region and the second region of the source of the first transistor are short-circuited to each other.

4. A memory, in integrated circuit form, comprising:
   a plurality of transistors that form a corresponding plurality of memory cells, wherein each transistor has a drain and a source separated by a conduction channel, wherein a first transistor forms a corresponding programmed cell, wherein the conduction channel contacts a first region of the source, and wherein a doping type of the first region of the source is modified to a different doping type such that the conduction channel and the first region are of the same doping type, and wherein the first region of the source of the transistor is short-circuited to a second region of the source of the first transistor, the second region being of a different doping type than the first region;
   wherein a second transistor forms a corresponding non-programmed cell, and wherein the source of the first transistor is connected to the source of the second transistor to form a common source.

5. A memory, comprising:
   a plurality of cells formed in a substrate of a first doping type, the plurality of cells including a programmed first cell having a drain of a second doping type, a conduction channel of the first doping type, and a source, wherein the source includes a first region in contact with the conduction channel, wherein a doping type of the first region is modified to a different doping type such that the conduction channel and the first region have the same doping type;
   wherein the source of the programmed first cell further includes a second region of the second doping type contacting the first region; and
   wherein the programmed first cell further includes a contact line that contacts the first region and the second region of the source of the programmed first cell to form a short-circuit therebetween.

6. The memory of claim 5,
   wherein the drain of the programmed first cell has a doping concentration higher than that of the second region of the source of the programmed first cell.

7. A memory, comprising:
   a plurality of cells formed in a substrate of a first doping type, the plurality of cells including a programmed first cell having a drain of a second doping type, a conduction channel of the first doping type, and a source, wherein the source includes a first region in contact with the conduction channel, wherein a doping type of the first region is modified to a different doping type such that the conduction channel and the first region have the same doping type;
   wherein the source of the programmed first cell further includes a second region of the second doping type contacting the first region, the first region is short-circuit to the second region and the doping type of the first region is different than the doping type of the second region; and
   wherein the plurality of cells further includes:
      a second cell including a source formed at least in part by the second region of the source of the programmed first cell.

8. A memory, comprising:
   a plurality of cells formed in a substrate of a first doping type, the plurality of cells including a programmed first cell having a drain of a second doping type, a conduction channel of the first doping type, and a source, wherein the source includes a first region in contact with the conduction channel, wherein a doping type of the first region is modified to a different doping type such that the conduction channel and the first region have the same doping type;
   wherein the source of the programmed first cell further includes a second region of the second doping type contacting the first region, the first and second regions being short-circuited to each other and the first region is of a different doping type than the second region; and
   wherein the source of the programmed first cell further includes:
      a third region of the second doping type disposed between the second region of the source of the programmed first cell and the substrate, the third region having a doping concentration higher than that of the second region of the source of the programmed first cell.

9. A memory, comprising:

a plurality of cells formed in a substrate of a first doping type, the plurality of cells including a programmed first cell having a drain of a second doping type, a conduction channel of the first doping type, and a source including non-conducting means for providing a non-conducting response in a region of the source that contacts the conduction channel to prevent a transistor effect from occurring between the drain and the source when predetermined voltages are applied to the programmed first cell to read the programmed first cell;

wherein the non-conducting means is a first region of the source of the programmed first cell contradoped such that the first region is of the first doping type to form a degenerate transistor as the programmed first cell; and wherein the source of the programmed first cell further includes a second region of the second doping type, and wherein the programmed first cell further includes means for short-circuiting together the first region and the second region of the source of the programmed first cell.

10. A memory, comprising:

a plurality of cells formed in a substrate of a first doping type, the plurality of cells including a programmed first cell having a drain of a second doping type, a conduction channel of the first doping type, and a source including non-conducting means for providing a non-conducting response in a region of the source that contacts the conduction channel to prevent a transistor effect from occurring between the drain and the source when predetermined voltages are applied to the programmed first cell to read the programmed first cell;

wherein the non-conducting means is a first region of the source of the programmed first cell contradoped such that the first region is of the first doping type to form a degenerate transistor as the programmed first cell, the first region of the source of the first cell is short-circuited to a second region of the source of the first cell and the first region is of a different doping type than the second region; and wherein the plurality of cells further includes:
  a second cell having a source connected to the source of the programmed first cell to form a common source.

11. A method for programming a cell, comprising a step of:

forming, in a substrate of a first doping type, a first transistor having a drain of a second doping type, and a source of the second doping type, such that a portion of the substrate forms a conduction channel between the source and the drain;

contradoping a first region of the source such that a doping type of the first region is modified to a different doping type to make the first transistor degenerate, the first region being in contact with the conduction channel; and short-circuiting the first region of the source and a second region of the source together;

wherein the step of contradoping includes the steps of:
  dividing the source into the first region, and a second region, wherein the first region contacts the conduction channel; and
  contradoping only the first region that contacts the conduction channel;
  wherein the first region is of a different doping type than the second region.

12. The method of claim 11, wherein the step of forming the first transistor includes a step of providing the drain with a doping concentration higher than that of the second region of the source.

13. A method for programming a cell, comprising a step of:

forming, in a substrate of a first doping type, a first transistor having a drain of a second doping type, and a source of the second doping type, such that a portion of the substrate forms a conduction channel between the source and the drain;

contradoping a first region of the source such that a doping type of the first region is modified to a different doping type to make the first transistor degenerate, the first region being in contact with the conduction channel; and forming, in the substrate, a second transistor having a source formed at least in part by a second region of the source of the first transistor;

wherein the step of contradoping includes the steps of:
  dividing the source into the first region, and a second region, wherein the first region contacts the conduction channel;
  short-circuiting the first region and the second region of the source to each other; and
  contradoping only the first region that contacts the conduction channel;
  wherein the first region is of a different doping type than the second region.

14. A method for programming a cell, comprising a step of:

forming, in a substrate of a first doping type, a first transistor having a drain of a second doping type, and a source of the second doping type, such that a portion of the substrate forms a conduction channel between the source and the drain; and contradoping a first region of the source such that a doping type of the first region is modified to a different doping type to make the first transistor degenerate, the first region being in contact with the conduction channel;

wherein the step of contradoping includes the steps of:
  dividing the source into the first region, and a second region, wherein the first region contacts the conduction channel; and
  contradoping only the first region that contacts the conduction channel; and wherein the step of forming the first transistor includes steps of:
  short-circuiting the first region and the second region of the source to each other wherein the first region is of a different doping type than the second region; and
  forming a third region of the second doping type disposed between the second region of the source and the substrate, the third region having a doping concentration higher than that of the second region of the source.

* * * * *